United States Patent [19]

Schröder

[11] 4,441,041
[45] Apr. 3, 1984

[54] CIRCUIT ARRANGEMENT FOR GENERATING A DIRECT CONTROL VOLTAGE WHICH IS DEPENDENT ON AN ALTERNATING VOLTAGE

[75] Inventor: Ernst Schröder, Hanover, Fed. Rep. of Germany

[73] Assignee: Licentia Patent-Verwaltungs-GmbH, Frankfurt, Fed. Rep. of Germany

[21] Appl. No.: 389,494

[22] Filed: Jun. 17, 1982

[30] Foreign Application Priority Data

Jun. 19, 1981 [DE] Fed. Rep. of Germany ....... 3124289

[51] Int. Cl.³ .............................................. H03G 3/10
[52] U.S. Cl. .................................... 307/494; 307/261; 330/141; 330/281
[58] Field of Search ............... 330/138, 141, 254, 280, 330/281; 333/14; 307/490, 494, 261; 328/142

[56] References Cited

U.S. PATENT DOCUMENTS

| | | | |
|---|---|---|---|
| 3,371,269 | 2/1968 | Wattson | 307/494 |
| 3,969,680 | 7/1976 | Wermuth | 330/136 X |
| 4,318,009 | 3/1982 | Schröder | 307/246 |
| 4,321,482 | 3/1982 | Schröder et al. | 307/262 |

FOREIGN PATENT DOCUMENTS 2830784 2/1980 Fed. Rep. of Germany .

OTHER PUBLICATIONS

D. Höppner et al., "Monolithisch integrierte NF-Kompander", *Wissenschaftliche Berichte AEG–Telefunken,* vol. 52, No. 1/2, Jan. 1979, pp. 97–104.
D. Höppner et al., "HIGH COM-ein Kompander zur breitbandigen Geräuschunterdrückung," *Technische Rundschau,* vol. 72, No. 41, Oct. 1980, pp. 9 and 13.
B. Wiedenroth, "High-Com-Überblick und Entwicklungsstand," *Funkschau,* vol. 52, No. 17, Aug. 14, 1980, pp. 67–71.

*Primary Examiner*—James B. Mullins
*Assistant Examiner*—Steven J. Mottola
*Attorney, Agent, or Firm*—Spencer & Frank

[57] ABSTRACT

The invention relates to a circuit arrangement in a compander system for generating a direct control voltage which is dependent on an alternating voltage with the circuit arrangement including a time constant switch. The conductance determining the time constant in a charging current circuit is constantly varied in the transfer range in dependence on the voltage of a charging capacitor when a time constant switch takes place from one fixed value to a second fixed value.

11 Claims, 7 Drawing Figures

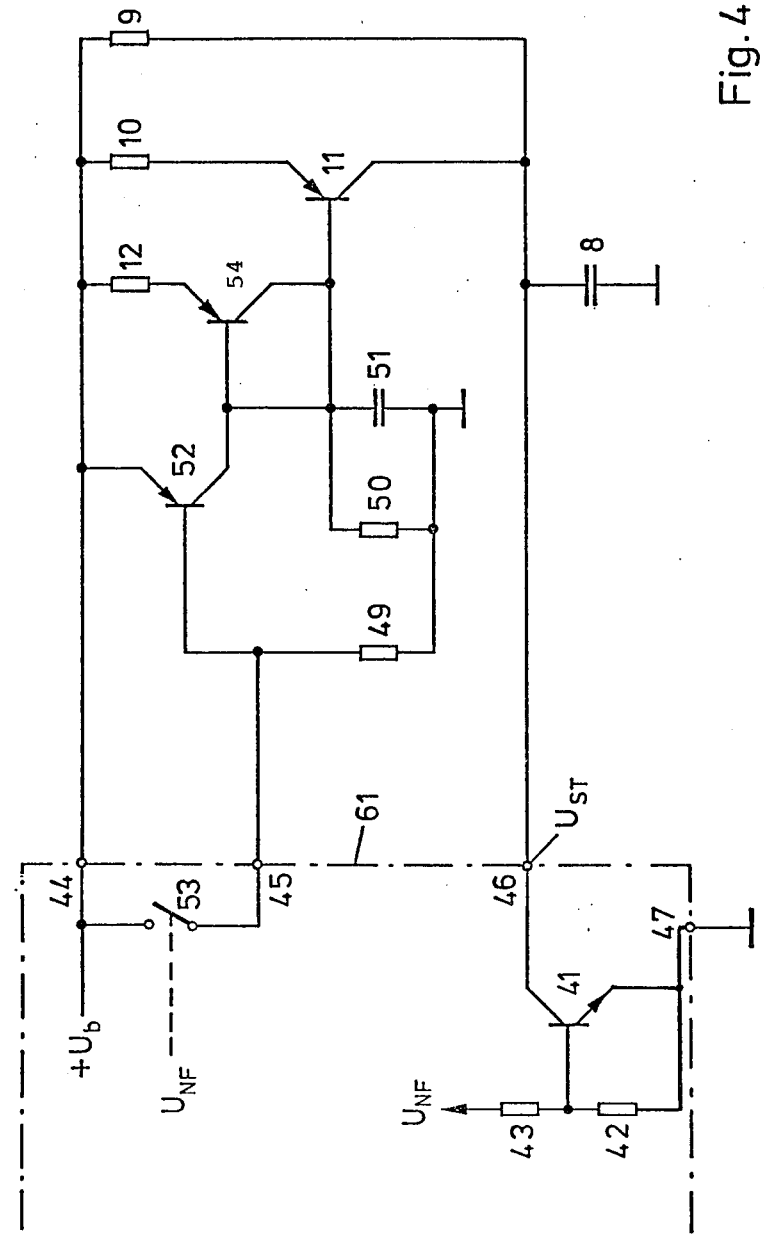

CIRCUIT ARRANGEMENT FOR GENERATING A DIRECT CONTROL VOLTAGE WHICH IS DEPENDENT ON AN ALTERNATING VOLTAGE

BACKGROUND OF THE INVENTION

The present invention relates to a circuit arrangement for generating a direct control voltage which is dependent on an alternating voltage. More particularly, the present invention relates to such a circuit arrangement, particularly for dynamic compression or expansion, including a first charging capacitor which is charged through a first charging circuit and is discharged through a first discharging circuit, and a second charging capacitor which is charged through a second charging circuit and a third charging circuit connected in parallel therewith and is discharged through a second discharging circuit, with the third charging circuit including a controllable current path which is actuated when the voltage of the first charging capacitor exceeds a given threshold value.

German published patent application DE-AS 2,830,784, corresponding to U.S. Pat. No. 4,321,482 issued Mar. 22, 1982 to Ernst Schröder, discloses the use of such a circuit arrangement in compander systems.

For good operation of a compander system it is necessary to have a short decay time so that, after an abrupt end of the useful signal, there will be no noise tails. On the other hand, too short a delay time with low-frequency useful signals leads to high fluctuations in the control voltage and thus to signal distortion through regulation. To avoid such signal distortion, a long decay time is required. These contradictory requirements are met by time constant switching. Such switching is effected at the compander end by the alternating voltage output signal and at the expander end by the alternating voltage input signal.

Such charging time constant switching is realized, for example, by a retriggerable monoflop, as disclosed in "Wissenschaftliche Berichte AEG-TELEFUNKEN" [Scientific Reports from AEG-TELEFUNKEN], volume 52 (1979), page 103.

In this circuit, a capacitor is charged via a current source. One input of a differential amplifier is connected with the capacitor, the other input with a reference voltage. The charging of the capacitor first produces a time delay. If the capacitor voltage finally reaches the level of the reference voltage, the differential amplifier is switched very quickly. This is done in a range of about 50 mVolt. The switching of a regulating time constant effected by this circuit therefore occurs very quickly.

This sudden switching of the time constant becomes audible if, due to tolerances of the time determining capacitor and/or its charging current, the switching moments of the time constants in the compressor and the expander no longer coincide.

SUMMARY OF THE INVENTION

It is the object of the present invention to reduce tolerance influences of the time determining members of the prior art circuit with low expenditures.

The above object is achieved by a circuit arrangement for generating a direct control voltage which is dependent on an alternating voltage input signal, particularly for dynamic compression or expansion, comprising, in combination: an input terminal for an alternating voltage input signal; a first charging capacitor; a first charging circuit means for charging the first capacitor; a first discharging circuit means, controlled by the signal at the input terminal, for discharging the first capacitor; a second charging capacitor whose charge voltage constitutes the control voltage; a second charging circuit for charging the second capacitor; a second discharging circuit means, controlled by the signal at the input terminal, for discharging the second capacitor; a third charging circuit means, connected in parallel with the second charging circuit means, for charging the second capacitor, with the third charging circuit means including a controllable current path which is actuated when the voltage of the first charging capacitor exceeds a given threshold value; and further circuit means for causing the charging current of the third charging circuit means to have a first current value at a voltage across the first charging capacitor below the threshold value and a second value when the capacitor voltage is above the threshold value with the first or second value being proportional to the voltage of the first charging capacitor up to a limit value, and with the range of the first value immediately following the range of the second value.

BRIEF DESCRIPTION OF THE DRAWINGS

FIG. 3 shows time diagrams for the current or voltage which are used to explain the invention, with:

FIG. 3d showing the curve of the control voltage across terminal 2.

FIG. 4 is a schematic circuit diagram showing a still further embodiment of the circuit according to the invention.

DETAILED DESCRIPTION OF THE PREFERRED EMBODIMENTS

Figure 1:
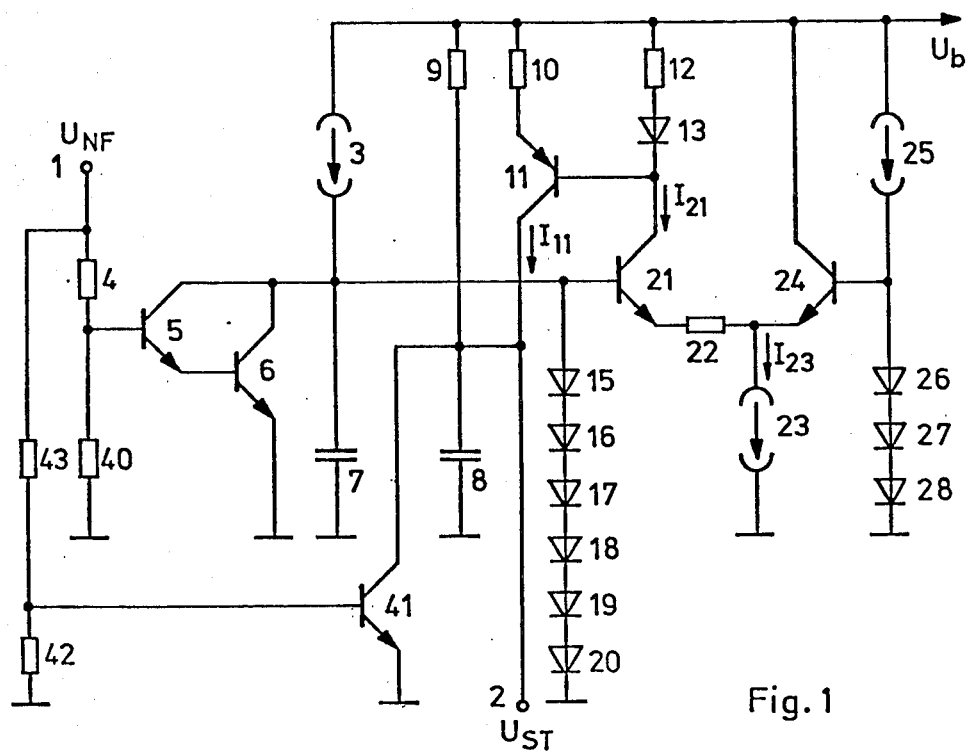
FIG. 1 is a schematic circuit diagram of one embodiment of the circuit according to the invention.

FIG. 1 shows the configuration of a circuit according to the invention. The circuit includes an input 1 for the low frequency alternating voltage $U_{NF}$ and an output 2 for the direct control voltage $U_{ST}$. The signal at input 1 controls, via a voltage divider 4, 40, the base of transistors 5 and 6 which are connected as a Darlington circuit. The emitter of transistor 6 is connected to reference potential as is the other end of voltage divider 4, 40. The collectors of transistors 5 and 6 are connected together and with the common connection of one terminal of a current source 3, a charging capacitor 7, a diode path 15-20 containing six diodes, and the base of a transistor 21. The capacitor 7 and the diode path 15-20 have their second or opposite terminals connected to reference potential.

Transistor 21 and transistor 24 together form a differential amplifier. The emitter of transistor 21 is connected, via a feedback resistor 22, with the emitter of transistor 24 and with one terminal of a current source 23, whose second or opposite terminal is connected to reference potential. The collector of transistor 24 is connected to the operating voltage $U_b$. The base of transistor 24 is connected to the common connection of a diode path 26–28 containing three diodes, and a current source 25. The second terminal of the diode path 26–28 is connected to reference potential, while the second terminal of the current source 25 is connected to the reference voltage $U_b$. The collector of transistor 21 is connected with the base of a transistor 11 and additionally, via the series connection of a diode 13 and a resistor 12, with the operating voltage $U_b$. The emitter of transistor 11 is connected to the operating voltage $U_b$ via a resistor 10. The collector of transistor 11 leads to the common point of connection of the output 2, a second charging capacitor 8, a resistor 9 and the collector of a transistor 41. The second terminal or contact of capacitor 8 is connected to reference potential and the other terminal of resistor 9 is connected to the operating voltage $U_b$ so that the capacitor 8 is charged by the operating voltage via resistor 9. Transistor 41 has its emitter connected to reference potential and its base connected via a further voltage divider 42, 43 to the input 1, whereby transistor 41 is controlled by the low frequency signal at input 1.

Transistors 5, 6 and transistor 41 each represent a respective threshold circuit. If the input voltage at input 1 exceeds a threshold set by the base-emitter voltage of transistor 41 and the voltage divider 43, 42, the collector-emitter path of transistor 41 becomes conductive. As a result, capacitor 8 is discharged toward more negative values via the collector-emitter resistance of transistor 41, and the output voltage at terminal 2 becomes more negative. If the input voltage drops back to below this threshold value, transistor 41 is blocked again and capacitor 8 is charged again toward more positive values via resistor 9, and thus the output voltage at output 2 becomes more positive.

Figure 2:
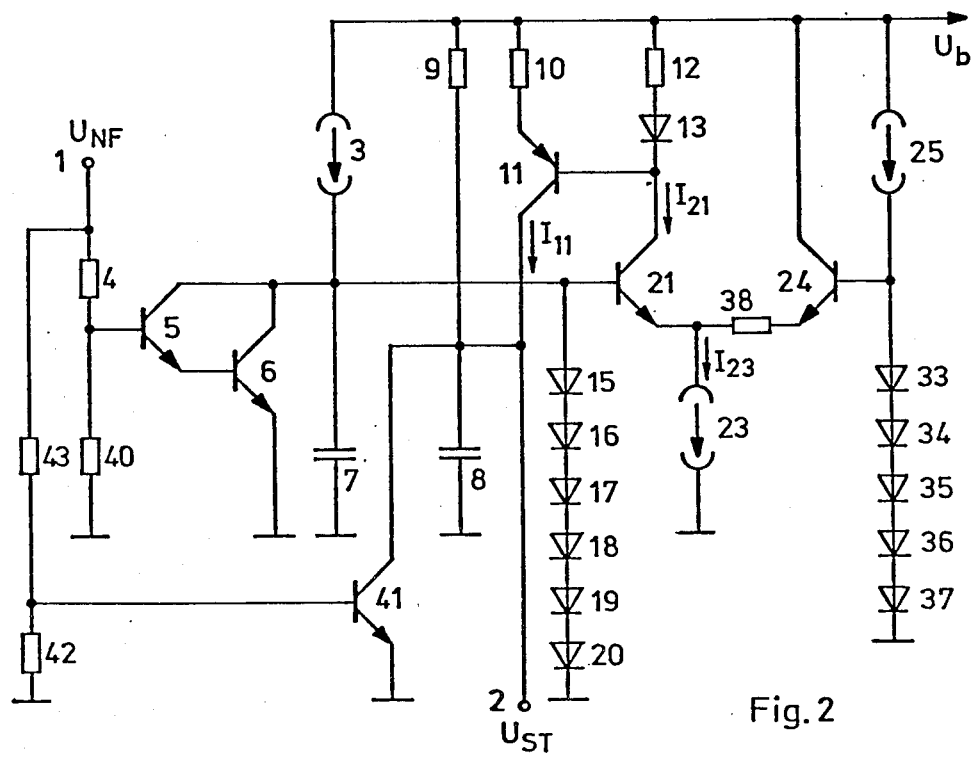
FIG. 2 is a schematic circuit diagram of another embodiment of the circuit according to the invention.

In this respect, components 8, 9, 41, 42 constitute a fast rectifier circuit as it is disclosed in German Patent No. 2,406,258, FIG. 12 and German allowed application DE-AS 2,403,799, FIG. 2, both corresponding to U.S. Pat. No. 3,969,680 issued July 13, 1976.

The remaining threshold switch or circuit comprised of transistors 5, 6 and voltage divider 4, 40 acts as a discharge current path connected in parallel to capacitor 7. If a signal is present at input 1, which signal is greater than the threshold value of the arrangement 4, 40, 5, 6, the capacitor 7 is quickly discharged via transistor 6 down to a residual voltage of approximately one diode voltage. This results in the voltage across the base of the transistor 24 being higher by two diode voltages than the voltage across the base of transistor 21. The transistor 21 is thus blocked, its collector current $I_{21}$ is zero and so is the output current $I_{11}$ of the current mirror circuit 10, 11, 12, 13. Therefore, only the charging current through resistor 9 is effective in charging capacitor 8. The large time constant results from the product of capacitor 8 and resistor 9. If the signal at input 1 falls below the threshold voltage of the arrangement 4, 40, 5, 6, the Darlington circuit 5, 6, is blocked. The capacitor voltage of capacitor 7 then increases linearly, originating from the current source 3, from one diode voltage to a value limited by the six diodes 15–20. The time which expires until the capacitor 7, and thus the base of transistor 21, reaches three diode voltages, i.e. the same voltage as the base of transistor 24, is the delay time or holding time of the circuit. When this voltage is reached at the base of transistor 21, it continuously takes over the current $I_{23}$ from current source 23, until the current $I_{23}$ is taken over completely by transistor 21, e.g. at 5 diode voltages, and transistor 24 blocks. The voltage transfer range is equal to the product of the feedback resistance 22 and current $I_{23}$. The current transfer to transistor 21 is proportional to the capacitor voltage of capacitor 7. The time for the current transfer lies in the order of magnitude of the time delay of the circuit. At the same time, the rise of current $I_{21}$ in transistor 21 is supplied to capacitor 8 as current $I_{11}$ by the current mirror circuit comprising resistors 10 and 12, diode 13 and transistor 11. Current $I_{11}$ is set according to $I_{11max} = I_{23} \cdot R_{12}/R_{10}$. The constantly rising current $I_{11}$, in contradistinction to that in German published application DE-AS 2,830,784, corresponding to U.S. Pat. No. 4,321,482, causes the course of the control voltage at output 2 to become more curved or rounder.

FIG. 2 shows another embodiment of the circuit according to the invention. This circuit differs from that of FIG. 1 in that the feedback resistor 22 is omitted, and a feedback resistor 38 is provided in the emitter branch or path of transistor 24. Moreover, the diode path 26–28 of FIG. 1 is replaced by a diode path 33–37 containing five diodes.

In this circuit, current transfer begins at transistor 21, if its base voltage reaches a value which corresponds to the base voltage of transistor 24 minus the voltage $I_{23} \cdot R_{38}$ which results due to current $I_{23}$ flowing through resistor 38. The current transfer range corresponds to the product of $I_{23} \cdot R_{38}$.

In both described embodiments, the diode path 15–20 at the base of transistor 21 may be replaced by a corresponding Zener diode since this diode path serves only to limit the voltage across capacitor 7 above a value which is required for the full current takeover by transistor 21. The diode path 15–20 may also be omitted, in which case the voltage across the capacitor rises up to the operating voltage $U_b$.

Diode paths 26–28 and 33–37 and the current source 25 can likewise be replaced by other suitable circuits which generate an essentially constant voltage across the base of transistor 24.

Figure 3A:
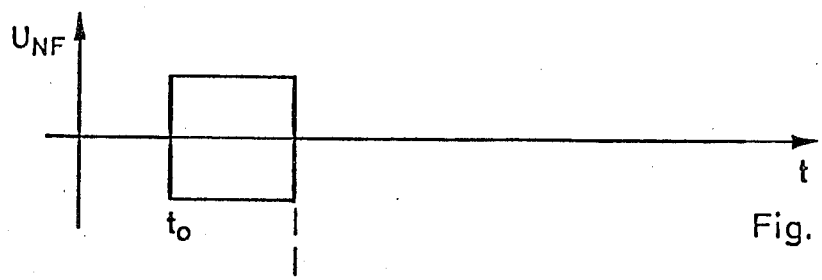
FIG. 3a showing the curve of a signal voltage across terminal 1.
Figure 3B:
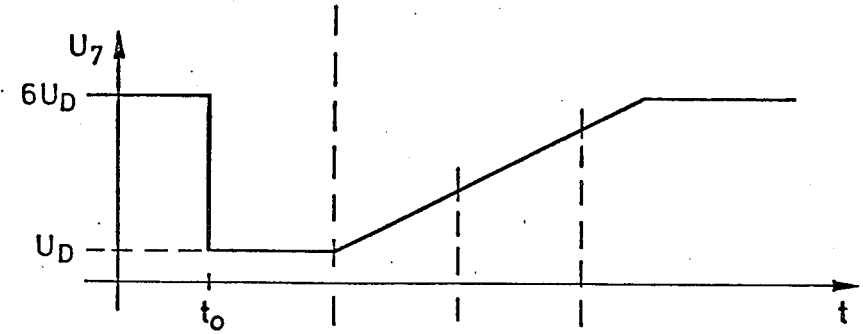
FIG. 3b showing the capacitor voltage of capacitor 7.
Figure 3C:
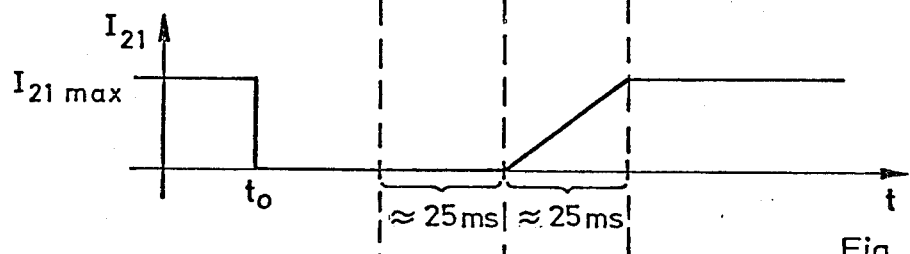
FIG. 3c showing the current curve through the transistor 21.
Figures 3, 3D:
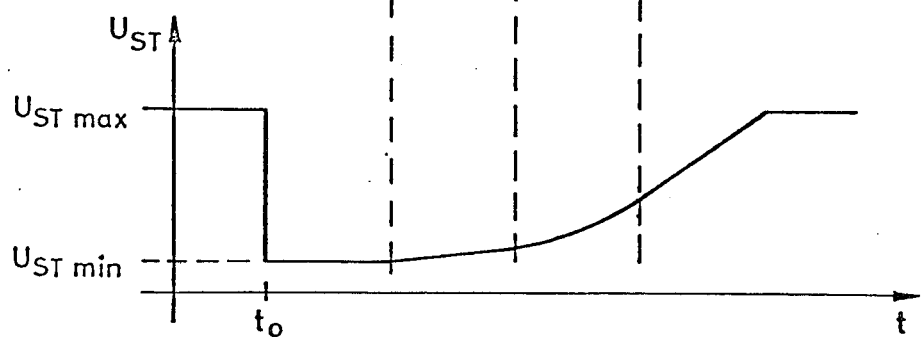

In the operation of the described circuit, if the signal, which begins at $t = T_O$ as shown in FIG. 3a, present at input 1 is greater than the threshold voltage of the arrangement 4, 5, 6, 40, the Darlington circuit 5, 6 becomes conductive during the signal duration. As shown in FIG. 3b, the capacitor voltage $U_7$, which had been at its maximum value of six diode voltages ($6U_b$), is immediately discharged to about one diode voltage. The current through transistor 21, according to FIG. 3c, therefore becomes zero. If the voltage of FIG. 3a also exceeds the threshold value of the arrangement 41, 42, 43, capacitor 8 is likewise discharged and, as shown in FIG. 3d, the control voltage $U_{ST}$ at output 2 has its minimum value. If the signal $U_{NF}$ at input 1 becomes zero or drops to below the respective threshold voltages, transistors 5, 6, and 41 are blocked. As shown in FIG. 3b, the capacitor voltage $U_7$ then rises continuously to the value limited by diodes 15–20, i.e. $6U_D$. As can be seen in FIG. 3c, the current $I_{21}$ begins to flow as soon as the capacitor voltage $U_7$ has reached the value of three diode voltages. Thereafter, the current $I_{21}$ then increases proportionally to the capacitor voltage $U_7$ from zero to its maximum value. The resulting voltage curve at output 2 is shown in FIG. 3d. During the holding time of the circuit, i.e. until the current $I_{21}$ begins to flow, the control voltage $U_{ST}$ increases slowly. The rise is determined by the large time constant formed of capacitor 8 and resistor 9. After the holding time, the control voltage $U_{ST}$ becomes rounder. The constantly increasing current $I_{11}$, which is generated by the current mirror circuit from current $I_{21}$, is superposed on the current supplied to capacitor 8 through resistor 9. Thus the constantly rising current $I_{11}$ produces a curved, i.e. rounded, rise in the control voltage which increases to its maximum value. If the control voltage $U_{ST}$ is generated in this manner, two rounded curves are now displaced with respect to one another as a result of the above-mentioned tolerance influences. The influence of this shift is smaller on the average than in the prior art circuit.

FIG. 4 shows a further embodiment of the invention which is used as a peripheral circuit for the known HIGH-COM IC U401B, manufactured by AEG-Telefunken, Heilbronn, West-Germany here marked with the reference numeral 61, and which also causes the control voltage $U_{ST}$ to be rounded. One terminal 44 of the IC 61, at which the operating voltage $U_b$ is present, is connected to the emitter of a transistor 52, via a resistor 12 to the emitter of a transistor 54, via a resistor 10 to the emitter of transistor 11, and to one terminal of a resistor 9. The second terminal of resistor 9 is connected to the collector of transistor 11, one terminal of charging capacitor 8, and an output terminal 46 of the IC 61. The other terminal of charging capacitor 8 is connected to the reference potential. Output terminal 45 of the IC 61 is connected with the base of a transistor 52 and with one terminal of a resistor 49. The other terminal of resistor 49 is connected to reference potential and to the common connecting point of one terminal of a resistor 50 and a capacitor 51. The resistor 50 and the capacitor 51 form a parallel circuit whose other common connection point is connected with the collector of transistor 52, the base of transistor 54, the collector of transistor 54, and the base of transistor 11. Terminal 47 of the IC 61 is connected to reference potential.

Terminals 44 and 45 of the IC 61 have an internal switch 53 which is controlled by the signal voltage $U_{NF}$. If a signal voltage $U_{NF}$ is present, switch 53 is open; if the signal voltage $U_{NF}$ drops below a threshold value (see German published application DE-AS 2,850,736 corresponding to U.S. Pat. No. 4,318,009, issued Mar. 2, 1982 to Ernst Schröder), switch 53 is closed with a time delay which is effected by a circuit element in IC 61 (see Wissenschaftliche Berichte, AEG-Telefunken 52 (1979) 1-2, page 103). Equivalently to the preceding embodiments, the internal circuitry of the IC 61 includes the voltage divider resistors 42, 43 and the transistor 41 connected between the input terminal for voltage $U_{NF}$ and the terminals 46 and 47. The control voltage $U_{ST}$ is present at terminal 46 of IC 61.

With the circuit of FIG. 4, if a signal $U_{NF}$ is present, switch 53 is open. This causes transistor 52 to conduct and charge capacitor 51 to the operating voltage $+U_b$ at terminal 44. Transistor 11 is blocked, and no current flows through resistor 10 and transistor 11 to capacitor 8. If the signal $U_{NF}$ is no longer present, switch 53 is closed with a time delay and thus transistor 52 is blocked as well. Capacitor 51 now discharges slowly through resistor 50. The reduction of the voltage across the base of transistor 54 causes the latter to become conductive gradually and a constantly increasing current flows through resistor 50 to ground. In the equilibrium state, a voltage develops across capacitor 51 which is determined by the current flowing through resistor 12, transistor 54 and resistor 50. The current, which increases until the equilibrium state is reached, is supplied to capacitor 8 by the current mirror circuit 10, 11, 12, 54. The voltage present across capacitor 8 corresponds to the control voltage $U_{ST}$. The discharging circuit of capacitor 8, including the voltage divider 43, 42 and transistor 41, is set so that it is actuated by the peaks of the signal. Capacitor 8 is charged constantly by the current given by resistor 9.

It will be understood that the above description of the present invention is susceptible to various modifications, changes and adaptations, and the same are intended to be comprehended within the meaning and range of equivalents of the appended claims.

What is claimed is:

1. A circuit arrangement for generating a direct control voltage which is dependent on an alternating voltage input signal, particularly for dynamic compression or expansion, said circuit arrangement comprising, in combination: an input terminal for an alternating voltage input signal; a first charging capacitor; a first charging circuit means for charging said first capacitor; a first discharging circuit means, controlled by the signal at said input terminal, for discharging said first capacitor; a second charging capacitor whose charge voltage constitutes said control voltage; a second charging circuit for charging said second capacitor; a second discharging circuit means, controlled by the signal at said input terminal, for discharging said second capacitor; a third charging circuit means, connected in parallel with said second charging circuit means, for charging said second capacitor, said third charging circuit means including a controllable current path which is actuated when the voltage of said first charging capacitor exceeds a given threshold value and further circuit means for causing the charging current of said third charging circuit means to have a first current value at a voltage across said first charging capacitor below said threshold value and a second value when said voltage is above said threshold value with said first or second value being proportional to the voltage of said first charging capacitor up to a limit value, and with the range of said first value immediately following the range of said second value.

2. A circuit arrangement as defined in claim 1, wherein said third charging circuit forms a first branch in a current mirror circuit whose second branch is included in said further circuit means; and wherein the current in said second branch of said current mirror circuit is determined by the magnitude of the voltage of said first charging capacitor.

3. A circuit arrangement as defined in claim 2, wherein said further circuit means includes a feedback connected amplifier through which said current of said second branch of said current mirror circuit is conducted.

4. A circuit arrangement as defined in claim 3 wherein said amplifier is a differential amplifier having a first and a second transistor.

5. A circuit arrangement as defined in claim 4, wherein said second branch of said current mirror circuit forms the collector circuit of said first transistor of said differential amplifier; and the base of said first transistor is connected with said first charging capacitor.

6. A circuit arrangement as defined in claim 4, wherein the emitters of both said first and second transistors of said differential amplifier are connected together via a resistor.

7. A circuit arrangement as defined in claim 6, wherein the emitter of one of said first and second tranistors is connected to ground via a current source.

8. A circuit arrangement as defined in claim 4, wherein the transfer value of the range of said first current value to the range of said second value of the charging current of said third charging circuit is determined by the bias across the base of said second transistor of said differential amplifier.

9. A circuit arrangement as defined in claim 1 further comprising a limiting circuit connected to said first charging capacitor to limit the voltage of said first charging capacitor.

10. A circuit arrangement as defined in claim 1, wherein the charging current of said third charging circuit means below said threshold value of the voltage across said first charging capacitor is almost zero.

11. A circuit arrangement as defined in claim 1, wherein the charging current of said third charging circuit means above said threshold value of the voltage across said first charging capacitor is almost zero.

* * * * *